United States Patent [19]

Moorey

[11] 4,126,795

[45] Nov. 21, 1978

[54] TIMING UNIT

[76] Inventor: Ernest J. Moorey, 148 Cleeve Dr., Ivybridge, Devon, England

[21] Appl. No.: 789,089

[22] Filed: Apr. 20, 1977

[30] Foreign Application Priority Data

Apr. 22, 1976 [GB] United Kingdom ............... 16267/76

[51] Int. Cl.² .......................................... H03K 5/153
[52] U.S. Cl. .................................. 307/293; 307/225 R; 307/353; 307/362; 307/246; 307/282; 307/227
[58] Field of Search ................ 328/151; 307/353, 227, 307/228, 293, 362, 225 R, 246, 282

[56] References Cited

U.S. PATENT DOCUMENTS

| 2,933,689 | 4/1960 | Johnson | 328/151 X |
|---|---|---|---|
| 3,121,803 | 2/1964 | Watters | 307/225 R |
| 3,139,532 | 6/1964 | Hjermstad | 307/225 R |
| 3,139,532 | 6/1964 | Hjermstad | 307/228 X |
| 3,597,601 | 8/1971 | Bahring | 328/151 X |
| 3,819,955 | 6/1974 | Hilbert | 307/227 X |
| 3,968,447 | 7/1976 | Baylac et al. | 328/151 X |

Primary Examiner—John S. Heyman
Attorney, Agent, or Firm—Cushman, Darby & Cushman

[57] ABSTRACT

A fail-safe long interval timer has a capacitor which is charged progressively and the voltage across which is sampled momentarily at intervals, without fully discharging the capacitor, by connecting a pulse transformer across the capacitor for the duration of very short pulses which act on a solid state switching element. When the sampled pulses reach a threshold amplitude level a threshold device is triggered, after a time interval which will be determined by the charging circuit and the capacitor as well as the characteristics of the sampling circuit.

4 Claims, 4 Drawing Figures

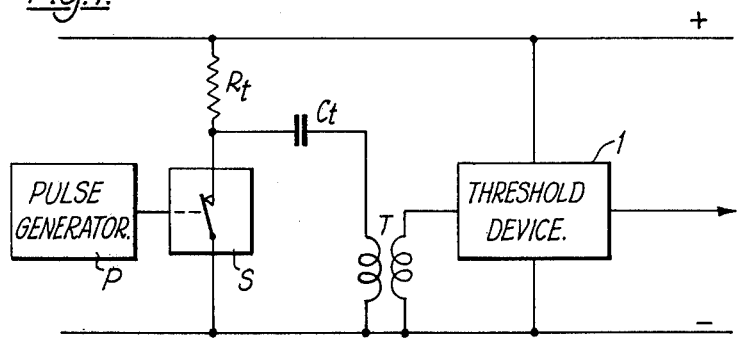
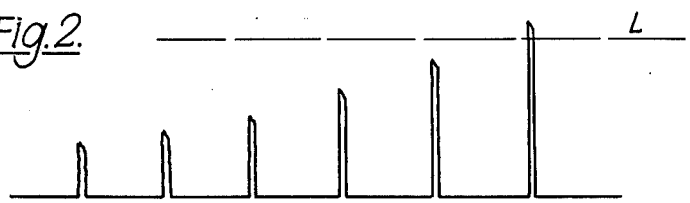
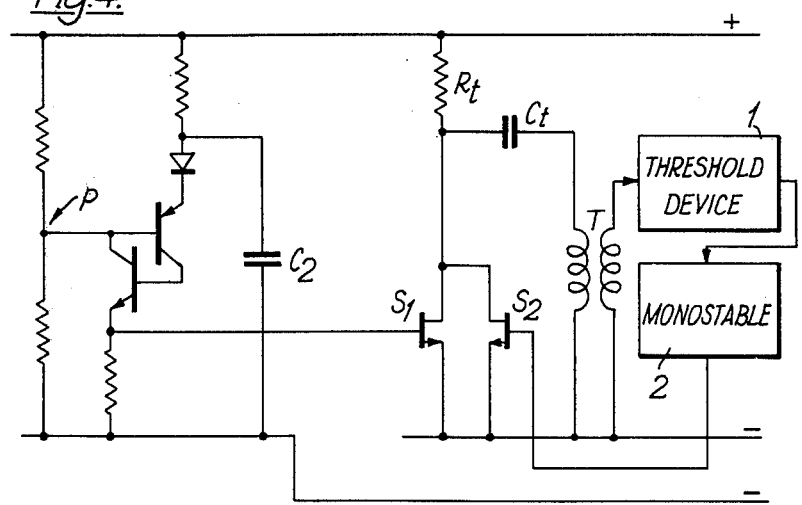

TIMING UNIT

This invention relates to a timing unit.

The use of a resistance-capacitance circuit to time a predetermined interval is very well known. In general, for the purpose of timing a long interval, large capacitances would be required, and moreover, in conventional resistance-capacitance circuits, the timed interval could decrease in length in certain circumstances, for example upon failure of the timing capacitor. This would be unacceptable for a timer employed in, for example, a railway signalling application, where a fail-safe characteristic is essential — that is to say, failure of any component of the timer should result in the timer ceasing to function or increasing its timed interval.

The present invention aims to provide an improved timing unit capable of timing relatively long intervals, with a fail-safe characteristic.

According to the present invention there is provided a timing unit comprising a capacitor connected in a charging circuit, means for connecting a sampling circuit across the capacitor momentarily at intervals, to monitor the voltage across the capacitor without fully discharging it and thereby to generate pulses at intervals in the sampling circuit, and a threshold device connected to the sampling circuit to provide an output signal when the sampled pulses reach a threshold amplitude, after a time interval which is determined by the charging circuit and dependent upon the value of the capacitor.

Since the capacitor is only partially discharged by each sampling of the capacitor, the successive pulses generated in the sampling circuit will have progressively higher amplitude until the threshold amplitude determined by the threshold device is reached, when an output signal will be provided. The time interval between the commencement of charging of the capacitor and the output from the sampling circuit will be determined solely by the capacitor and its charging circuit.

Preferably the sampling circuit comprises a switch element operated by a train of pulses each of which causes closure of the switch element for a time interval so short that the capacitor is only partially discharged during each closure of the switch. The switch element is preferably such that it is closed in the quiescent state of the unit. Thus in the event of failure of the switch element the capacitor will be permanently short-circuited, resulting in the timing unit becoming non-operational. A suitable switch element for this purpose is a junction field effect transistor.

The switch element, for example a field effect transistor, may be closed periodically by pulses from a pulse generating circuit capable of providing a succession of short pulses.

In a preferred embodiment the sampling circuit includes a pulse transformer through the primary of which the capacitor discharges partially upon closure of the switch element. The pulse transformer extracts a small proportion of the energy stored in the capacitor during each sampling time interval represented by the closure of the switch element, this energy being utilized in the transformer to trigger the threshold detector when the pulse amplitude reaches the predetermined threshold level.

The output signal of the threshold device may be used to operate a switch or relay, providing a timing function. Alternatively, the threshold device may be connected to a monostable circuit which closes a short circuiting switch connected across the capacitor when triggered by the output signal of the threshold device to discharge the capacitor completely. When the monostable circuit returns to its stable condition the unit will then revert to its initial condition and a further capacitor charging cycle will commence. Utilized in this way the timing unit will provide a square wave output having a low frequency which will not increase, so that the timing unit can be utilized as a low frequency generator in signalling applications.

The invention will now be described, by way of example only, with reference to the accompanying purely diagrammatic drawings, in which:

FIG. 1 is a schematic representation of a timing unit according to the invention, illustrating the principle of operation of the unit;

FIG. 2 illustrates diagrammatically the succession of pulses generated at the input to the threshold device of the timing unit shown in FIG. 1;

FIG. 4 is a diagrammatic circuit illustrating a low frequency pulse generator utilising a timing unit according to the invention.

Figure 3:
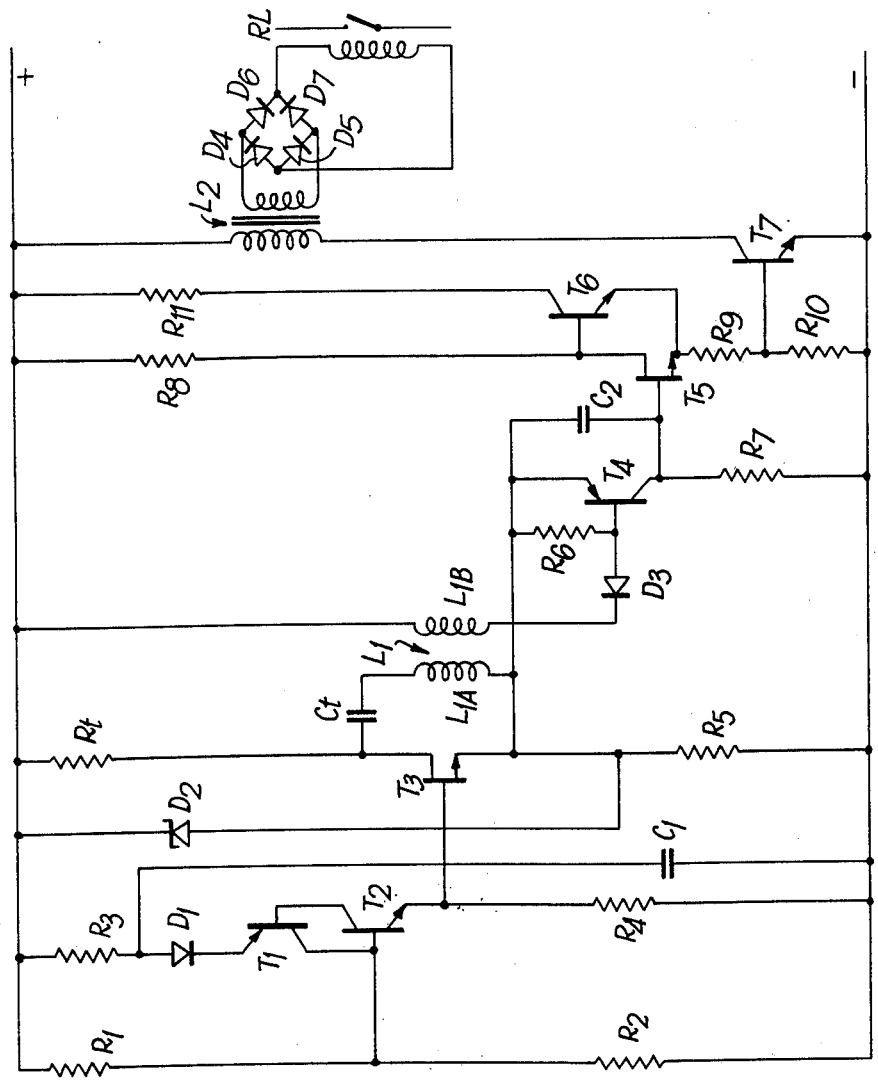
FIG. 3 is a circuit diagram of a practical timing unit according to the invention.

Referring first to FIG. 1, the timing unit consists essentially of a capacitor $C_t$ which is connected to a DC supply line through a resistor $R_t$ so as to charge slowly through this resistor and through the primary of a high frequency pulse transformer T. The charging of the capacitor $C_t$ is interrupted momentarily at intervals by the closure for a short time only of a switch element S connected across the capacitor $C_t$ and the primary of the pulse transformer T. The switch element S is closed for short time intervals only by short switching pulses (50 nanoseconds) provided by a pulse generator P. The switch element S closes for such a short time interval that the capacitor $C_t$ is only partially discharged by each closure of the switch element S. Each such partial discharge of the capacitor $C_t$ results in a current pulse in a sampling circuit constituted by the primary of the pulse transformer T, which then transmits a pulse to the input of a threshold device 1. Since the capacitor $C_t$ is only partially discharged by each closure of the switch element S the charge on the capacitor $C_t$ upon each successive closure of the switch element S will be progressively greater, and consequently the amplitude of the pulse sampled by the pulse transformer T at the input to the threshold device 1 will be progressively larger, as illustrated diagrammatically in FIG. 2, until it reaches a threshold amplitude L, when the threshold device 1 will be triggered into operation. When triggered, the threshold device 1 provides an operating output for a switch or relay, and will maintain this operating output only for as long as the pulse input to the threshold device 1 is maintained.

The operation of the timing unit depends essentially upon the periodic sampling of the charge on the capacitor $C_t$, without at any stage completely discharging the capacitor $C_t$, so that triggering of the threshold device 1, which can be utilized to indicate the timed interval, will occur after a number of sampling pulses which will be determined in turn by the resistance $R_t$ and capacitance $C_t$ of the capacitive charging circuit.

The frequency of the periodic sampling pulses provided by the pulse generator P must be so chosen in relation to the charging rate of the capacitor $C_t$ through the resistor $R_t$ that the resulting timed interval is for practical purposes determined by the magnitudes of the resistance $R_t$ and capacitance $C_t$. This timed interval will be independent of variation in the power supply, since such variation will affect both the charging rate of the capacitor and the threshold level of the threshold device by corresponding degrees.

FIG. 3 illustrates a typical circuit of a timer unit according to the invention. Resistors, capacitors and transistors in this circuit are labelled R, C and T respectively and numbered consecutively from left to right in the conventional manner, with the exception of the timing capacitor and resistor, which are labelled $C_t$ and $R_t$ respectively. The switch element S in the circuit of FIG. 3 is constituted by a junction field effect transistor $T_3$. Positive-going sampling pulses are generated by a two-transistor cascade switching circuit $T_1$, $T_2$ associated with a timing network $R_1$, $C_1$ which generates a train of very short pulses, typically of 50 nanosecond duration, which are applied to the gate of the field effect transistor $T_3$. The transistor $T_3$ is normally held non-conducting by the application of a suitable bias potential to its gate, and is switched on momentarily by each positive-going pulse applied to its gate. This in turn causes partial discharge of the capacitor $C_t$ (corresponding to the capacitor $C_t$ of FIG. 1) through the primary L1A of a pulse transformer L1. The secondary L1B of the pulse transformer is connected to a normally non-conducting switching transistor $T_4$ which is switched on momentarily when the pulses from the secondary L1B exceed a threshold level determined by the power supply, after a time interval which, as explained with reference to FIGS. 1 and 2, will be determined by the values of the resistor $R_t$, the capacitor $C_t$ and the turns ratio of the pulse transformer L1. A capacitor $C_2$ is connected across the emitter and collector of the transistor $T_4$ and together with a resistor $R_7$ acts as a pulse-stretching circuit: each time the transistor $R_4$ conducts it discharges the capacitor $C_2$ which, upon switching off of the transistor $T_4$, charges through the resistor $R_7$. A detector circuit comprising transistors $T_5$ and $T_6$ is connected to the collector of the transistor $T_4$ and provides a square wave output, of suitable mark to space ratio determined by the capacitor $C_2$ and resistor $R_7$. This square wave output is passed through an output transistor $T_7$, an output transformer L2 and a rectifier $D_4$-$D_7$ to a relay RL to maintain the latter energised by virtue of the pulses transmitted through the transistor $T_3$ and transformer L1 following the timed interval. If, following the timed interval, the pulses from the pulse transformer L1 should cease for any reason, the relay RL will be de-energised.

In the event of failure for any reason of the bias potential applied to the gate of the field effect transistor $T_3$ the latter will conduct, short-circuiting the capacitor $C_2$ and causing the pulses to disappear, so that the relay RL is de-energised.

The table set out below gives typical component values and type designations for a practical circuit according to the embodiment illustrated in FIG. 3:

| Resistors $R_1$, $R_2$ (ohms) | : 1K | Capacitors (Farads) | $C_1$ : 470p |
|---|---|---|---|
| $R_3$ | : 470K | | $C_2$ : 100p |
| $R_4$ | : 10 | | $C_t$ : 15μ |
| $R_5$ | : 470 | Transistors | $T_1$ : 2N2907A |
| $R_6$ | : 10K | | $T_2$ : 2N2369 |
| $R_7$ | : 1M | | $T_3$ : 2N4391 |
| $R_8$ | : 5.6K | | $T_4$ : 2N2907A |
| $R_9$ | : 470 | | $T_5$ : 2N4393 |
| $R_{10}$ | : 100 | | $T_6$ : 2N2222A |
| $R_{11}$ | : 470 | | $T_7$ : BUY47 |
| $R_t$ | : 50K-10M | | |
| Supply voltage | : 18 volts | | |

A typical practical circuit of a low frequency pulse generator incorporating the timing unit is illustrated diagrammatically in FIG. 4. A field effect transistor $S_1$ constitutes in effect the switch element S of FIG. 1 and is rendered conducting for short time intervals by the application to its gate of a succession of 50 nanosecond pulses derived from a pulse generating circuit. The pulse generating circuit consists of a two transistor cascade switching circuit which periodically short-circuits a capacitor $C_2$ charging from the DC supply.

In the circuit illustrated in FIG. 4 the threshold device 1 connected to the secondary of the pulse transformer T is connected to a monostable 2 which operates in response to triggering of the threshold device 1 to close a second switch element constituted by a further field effect transistor $S_2$ connected across the capacitor C, the duration of the pulse provided by the monostable 2 being such that the capacitor $C_t$ is completely discharged before the monostable 2 reverts to its original condition, re-opening the switch constituted by the transistor $S_2$, so that the progressive charging of the capacitor $C_t$ recommences. In effect this arrangement constitutes a low frequency pulse generator.

When the circuit of FIG. 3 is switched off or the power supply fails the field effect transistor $T_3$ will be normally conducting, short-circuiting the capacitor $C_t$. Similarly, in FIG. 4 the transistor switching elements $S_1$ and $S_2$ will be normally conducting when the power supply is switched off, short circuiting the capacitor $C_t$, so that the timing unit will be rendered inoperative. Failure of the capacitor $C_t$, either to open circuit or short circuit, will also result in failure of the timing unit to operate, so that the unit is essentially fail-safe in its operating characteristics. When used as a low frequency pulse generator, as illustrated in FIG. 4, the timing unit ensures that the frequency of the output square wave cannot under any circumstances increase.

I claim:

1. A timing unit comprising a capacitor, a resistive charging circuit connected to the capacitor, for charging said capacitor at a predetermined rate, a transistor switch element having its main electrode connected between one side of the capacitor and a reference potential, a pulse generating circuit for applying to the switch control electrode of the switch element a train of short duration sampling pulses each of which causes closure of the switch element for short periods of time such that the capacitor is only partially discharged during each closure of the switch element, a pulse transformer having its primary winding connected between the other side of the capacitor and said reference potential to provide output pulses of said short duration to its secondary output winding, much less than the time required for complete discharge of the capacitor through the pulse transformer, said output pulses having an amplitude proportional to and representing the instantaneous voltage across the charging capacitor, and a threshold device connected to the pulse transformer to provide an output signal when said output pulses reach a threshold amplitude, after a predetermined time interval which is determined by the value of the capacitor and the sampling pulse duration.

2. A timing unit as in claim 1, wherein the switch element comprises a field effect transistor and means applying a bias potential to said transistor to hold the latter non-conducting when the unit is switched on, the said transistor being conductive in the absence of said bias potential, when the unit is switched off, effectively short-circuiting the capacitor.

3. A timing unit as in claim 1, including a supply voltage line which provides a supply voltage to the capacitor and the charging circuit, and wherein the threshold device is connected to the supply voltage line, the threshold amplitude of the threshold device being derived from and proportional to the supply voltage.

4. A timing unit as in claim 1, including a monostable device connected to the output of the threshold device to be operated upon triggering of the threshold device, the output of the monostable device being connected to the transistor switch element to render the latter open-circuit for a predetermined time interval following each triggering of the threshold device.

* * * * *